United States Patent [19]
Yonemura et al.

[11] Patent Number: 5,233,676
[45] Date of Patent: Aug. 3, 1993

[54] OPTICAL MODULE

[75] Inventors: Ryugen Yonemura; Takanori Sawai; Kouji Kishimoto, all of Osaka, Japan

[73] Assignee: Sumitomo Electric Industries, Ltd., Osaka, Japan

[21] Appl. No.: 894,649

[22] Filed: Jun. 5, 1992

[30] Foreign Application Priority Data

Jun. 6, 1991 [JP] Japan .............................. 3-042278[U]

[51] Int. Cl.5 ................................................. G02B 6/00
[52] U.S. Cl. ...................................................... 385/88
[58] Field of Search ..................................... 385/88, 89

[56] References Cited

U.S. PATENT DOCUMENTS

| | | | |
|---|---|---|---|
| 4,439,006 | 3/1984 | Stevenson | 385/88 |
| 4,539,476 | 9/1985 | Donuma et al. | 385/88 |
| 4,911,519 | 3/1990 | Burton et al. | 385/88 X |
| 5,047,835 | 9/1991 | Chang | 385/88 X |

Primary Examiner—Akm E. Ullah
Attorney, Agent, or Firm—Wenderoth, Lind & Ponack

[57] ABSTRACT

An optical module has a connector housing and a photoelectric transfer unit received in the connector housing. The photoelectric transfer unit (photounit) has a lead frame, a photoelectric transfer element and an IC element for signal processing which are mounted on the lead frame. These elements are sealed in a transparent resin molding. The photoelectric transfer unit has six sides and has lead terminals protruding from one of the six sides. All sides of the unit except the side at which the lead terminals protrude are covered with a metal shield case formed with a hole as a light path leading to the photoelectric transfer element.

2 Claims, 1 Drawing Sheet

OPTICAL MODULE

BACKGROUND OF THE INVENTION

This invention relates to an optical module for receiving light comprising a photoelectric transfer unit (hereinafter referred to as "photounit") packaged in a transparent resin molding and assembled in a connector housing, and more specifically to an optical module which can shield the photounit against electromagnetic waves with a simple structure.

Japanese Patent Publication 62-44828 and Japanese Utility Model Unexamined Publication 61-24705 teach means for protecting the photounit in a connector housing against electromagnetic waves.

In the former publication, a shield material having shielding properties against electromagnetic waves such as a layer of conductive film is laminated to the photounit covered with a transparent resin and the shield material layer is connected to a grounding pin of the photounit. Then the shield material layer is covered with an opaque resin layer.

In the latter publication, a metallized layer is formed on one side of a ceramic circuit board and a seal ring is secured to its edge. A metal shell is secured to the seal ring to seal the elements mounted on the board. The photounit thus made is put in a receptacle made of a conductive material so that the seal ring touches the receptacle. The shield against electromagnetic waves is provided by keeping namely the three members, the seal ring, the shell and the receptacle, at an AC grounding potential.

The technique disclosed in Japanese Patent Publication 62-44828 involves complicated manufacturing steps and thus is costly because transparent resin, shield material and opaque resin have to be laminated one on another.

The module disclosed in Japanese Utility Model Publication 61-24705, which uses a ceramic board, a seal ring, a metal shell and a conductive receptacle, is reliable. But the manufacturing steps are even more complicated than for the former module and its materials cost is too high to be acceptable.

SUMMARY OF THE INVENTION

It is an object of the present invention to provide an optical module which provides an excellent shielding effect against electromagnetic waves with simple and inexpensive structure.

According to this invention, in order to solve these problems, a metal shield case is used to cover all sides of the photounit except the side from which lead terminals protrude.

The photounit comprises a lead frame, and a photoelectric transfer element and an IC element for signal processing which are mounted on the lead frame. The elements are sealed in a transparent resin molding. The shield case is formed with holes as light paths leading to the photoelectric transfer element and is provided with a grounding terminal which is connected to a grounding circuit at the outside of a connector housing carrying the photounit.

Simply by covering the photounit with the separately formed shield case, the photounit can be shielded from the surroundings. Such a module can be manufactured easily with a minimum number of assembling steps.

The light passage holes formed in the shield case may be of a size barely large enough to provide the light path. Thus, electromagnetic waves scarcely pass therethrough. This assures high shielding properties against electromagnetic waves.

The optical module according to the present invention can be assembled easily and inexpensively merely by covering the photounit with the metal shield case. Still, it exhibits an excellent electromagnetic shieldability and noise resistance. Thus its reliability is high and it can be used in a noisy environment. For example, it can be used as a communication medium for factory automation machines and as an optical LAN used in a power plant, a substation or an ironworks or as a communication medium for an on-board high-speed communication circuit.

BRIEF DESCRIPTION OF THE DRAWINGS

Other features and objects of the present invention will become apparent from the following description made with reference to the accompanying drawings, in which.

DETAILED DESCRIPTION OF THE PREFERRED EMBODIMENT

Figure 1:
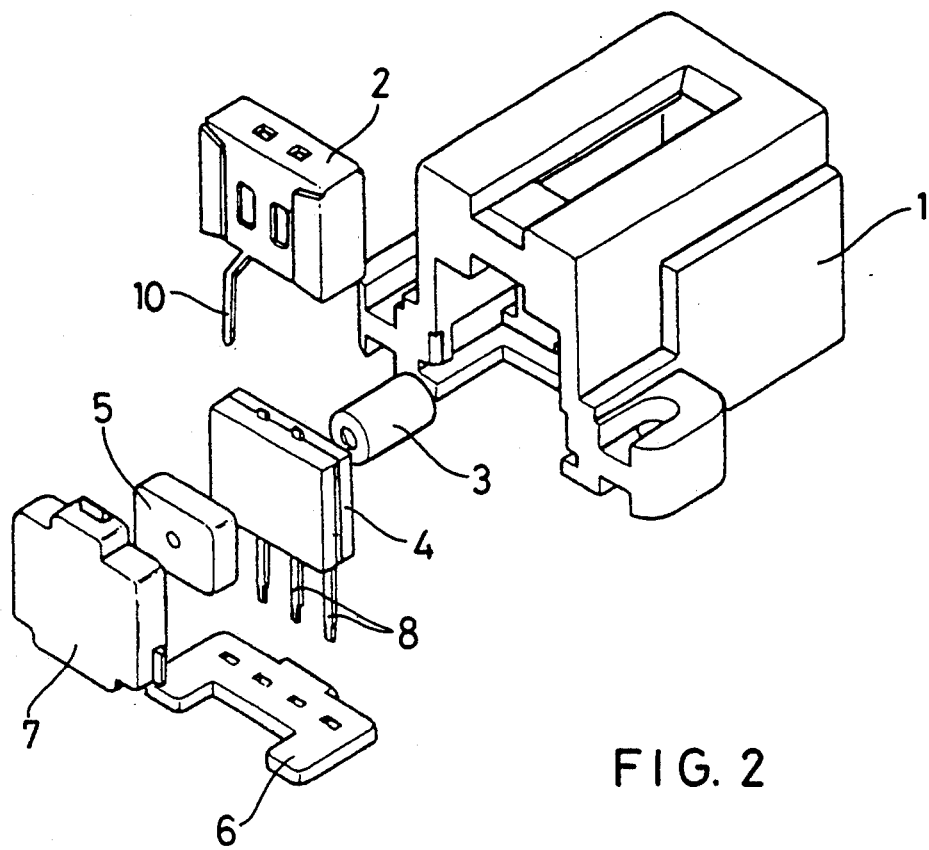
FIG. 1 is an exploded perspective view of the embodiment of the optical module according to the present invention.
Figure 2:
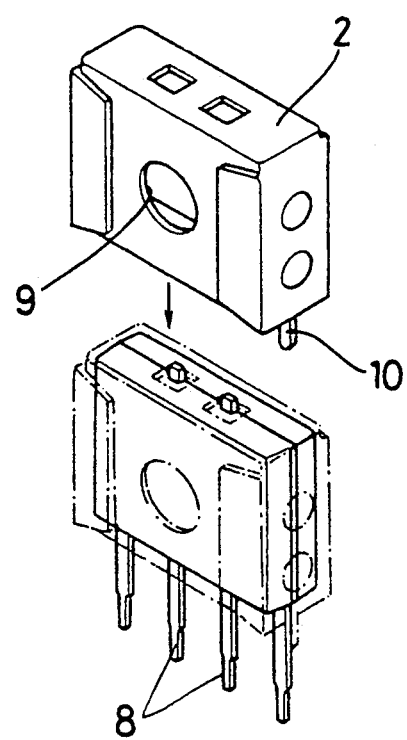
FIG. 2 is a perspective view of the shield case and the photounit showing their fronts.

In FIG. 1, the optical module comprises a connector housing 1, a shield case 2 formed by punching and bending a metal sheet, a relay fiber 3, a photounit 4, a rubber pad 5, a support base 6 for the photounit 4, and a press cap 7.

This optical module is assembled by pushing the relay fiber 3 into a guide hole formed in the connector housing 1, fitting the shield case 2 on the photounit 4, inserting the support base 6 with the photounit 4 into opposite grooves formed in the connector housing 1, and finally mounting the press cap 7 to the connector housing 1 with the rubber pad 5 pressed against the back of the photounit 4. In this state, the photounit 4, on which is fitted the shield case 2, is held in a fixed position, pressed by the cap 7 through the rubber pad 5.

The photounit 4 carries on its lead frame photoelectric transfer elements (a light emitting element and/or a light receptor element) and an IC element for signal processing having a rectifying circuit and an amplifying circuit. These components are sealed in a transparent resin molding. The photounit shown incorporates both light emitting and light receptor elements and thus has four lead terminals 8, which extend through holes formed in the support base 6 and protrude out of the connector housing 1.

On the other hand, the shield case 2 has a hole 9 as a light path leading to the photoelectric transfer elements and a grounding terminal 10. All sides of the photounit 4 except the side through which the lead terminals protrude are covered by the shield case 2. The grounding terminal 10 protrudes from the connector housing 1 in the same manner as the terminals 8 and is connected to a grounding circuit on a circuit board (not shown) carrying the connector housing 1.

What is claimed is:

1. An optical module comprising: a photounit having a photoelectric element, a processor constituted by an integrated circuit, a lead frame on which said photoelectric element and said integrated circuit are mounted, and a transparent resin cover in which said photoelectric element, said integrated circuit and said lead frame are embedded, said transparent resin cover having a plurality of outer surfaces defining six respective sides of the photounit, and said lead frame having lead terminals protruding from said transparent resin cover at one of said sides of the photounit; a metal shield case covering all of said sides of the photounit except for said one of the sides at which the lead terminals of said lead frame protrude from the transparent resin cover of the photounit, said metal shield case shielding said photounit from electromagnetic waves, said metal shield case including a ground terminal, and said metal shield case having a hole therein forming a path leading to said photoelectric element and along which path radiation can pass; and a connector housing to which said photounit covered by said metal shield case is mounted.

2. An optical module as claimed in claim 1, wherein said metal shield case including the ground terminal consists of one piece of bent sheet metal.

* * * * *